United States Patent
Rademacher et al.

[11] Patent Number: 5,925,847
[45] Date of Patent: Jul. 20, 1999

[54] HOUSING FOR APPLIANCES IN THE FIELD OF ELECTRICAL DATACOMMUNICATION

[75] Inventors: Karl-Heinz Rademacher, Schwarzenbruck; Jens P. Althaus, Lahnau, both of Germany

[73] Assignee: U.S. Philips Corporation

[21] Appl. No.: 08/272,406

[22] Filed: Jul. 8, 1994

[30] Foreign Application Priority Data

| Jul. 8, 1993 | [DE] | Germany | 43 22 753 |
| Sep. 21, 1993 | [DE] | Germany | 43 32 023 |
| Jan. 21, 1994 | [DE] | Germany | 44 01 683 |

[51] Int. Cl.⁶ .................................................. H05K 9/00
[52] U.S. Cl. ..................... 174/35 R; 455/90; 455/300
[58] Field of Search ..................... 361/814, 679, 361/680, 753, 799, 800, 816, 818; 455/90, 300; 200/308, 310, 314, 341, 304, 305; 174/35 R

[56] References Cited

U.S. PATENT DOCUMENTS

| 4,638,151 | 1/1987 | Suwa | 235/145 |
| 4,681,987 | 7/1987 | Suwa | 200/5 |
| 4,843,197 | 6/1989 | Kojima et al. | 200/406 |
| 4,919,873 | 4/1990 | Oishi et al. | 264/130 |
| 5,206,796 | 4/1993 | Thompson et al. | 361/424 |
| 5,233,506 | 8/1993 | Semenik et al. | 361/814 |
| 5,280,146 | 1/1994 | Inagaki et al. | 200/341 |

FOREIGN PATENT DOCUMENTS 3736892  5/1988  Germany.

OTHER PUBLICATIONS

Search report.

*Primary Examiner*—Kristine Kincaid
*Assistant Examiner*—Hung V Ngo
*Attorney, Agent, or Firm*—Dicran Halajain

[57] ABSTRACT

The invention presents a housing for appliances in the field of electrical datacommunication which is protected from outside interference in that it is provided with a part (13, 15) shaped from metal plating on the inside which is fixedly connected to a layer of thermoplastic material which forms the outer shell (12, 14) of the housing.

7 Claims, 8 Drawing Sheets

HOUSING FOR APPLIANCES IN THE FIELD OF ELECTRICAL DATACOMMUNICATION

FIELD OF THE INVENTION

The invention relates to a housing for appliances used in the field of electrical datacommunication, for example telephone housings, and to a method of manufacturing such housings.

BACKGROUND OF THE INVENTION

DE-GM 92 01 594 discloses a housing of the kind mentioned in the opening paragraph which is composed of two plastic shells which are provided on the inside with a metal screening. The metal screening may be provided, for example, by vapor deposition or by electroplating.

Owing to more stringent EMI-shielding requirements, metal layers are necessary on the insides of the housings with a thickness of approximately 20 μm to 40 μm. These layer thicknesses can no longer be reliably produced with an equal layer thickness in all locations of the housing by means of vacuum aluminum vapor deposition. Electrochemical layers require an additional surface treatment in order to fulfil the design requirements (paint). Furthermore, the environmental aspects are very critical and recycling is practically impossible.

DE-OS 34 29 353 discloses a plastic framework for appliance housings and components, in particular for mechanical and electromotive appliances, with partial elements made from non-plastic material. In this case, flat or previously shaped plate elements of a component of non-plastic material are laid in position in an injection molding tool and are joined together by means of thermoplastic material in a process which is known per se. In the injection molding tool, the edges of the non-plastic parts are surrounded by the injected thermoplastic material and interconnected thereby. The thermoplastic material grips around the relevant cut edges at one side or at both sides, acting as a claw. Necessary functional elements, for example reinforcement ribs or eyelets for supports and screw connections, may be shaped from thermoplastic material in the same process. The non-plastic inserted flat parts are manufactured in conventional manner as flat stampings or as shaped components such that any necessary holes, recesses, or the like can also be realized.

DE-AS 14 04 394 discloses a method of manufacturing a tub from several layers of synthetic resin. First a comparatively thin plate of thermoplastic material is shaped into a tub as an inner layer of the tub, and subsequently several layers of fiber-reinforced hardenable polymeric resins are provided on the outside of the shaped inner layer, depending on the static requirements, and hardened.

The invention has for its object to improve housings of the kind mentioned in the opening paragraph in view of more stringent requirements for interference protection.

SUMMARY OF THE INVENTION

According to the invention, this object is achieved in housings of the kind mentioned in the opening paragraph by an interior part shaped from metal plating which is fixedly connected to a layer of thermoplastic material which forms the outer shell of the housing. The connection is made, for example, by adhesion to the surface or by interlinking with injection-molded elements to be described further below. A housing constructed in this way has a stable metal inner shell. The required thicknesses of the inner metal layer can be achieved without problems thereby. In addition, such parts shaped from metal plating may serve to achieve a better heat distribution or heat removal. Moreover, such a construction is favorable for a simple waste disposal.

In an embodiment of the invention, the thickness of the part shaped from metal plating is, for example, approximately 0.2 mm to 0.3 mm. Such metal parts make it possible to achieve a very good heat removal and stability in the injection molding process.

In an embodiment of the invention, the part shaped from metal plating and the outer shell of the housing made from thermoplastic material are fixedly connected to one another by injection molding around edges or the like. This construction makes it possible to achieve a close and reliable connection of the metal part to the outer shell of the housing, which may be improved even further in that the part shaped from metal plating and the outer shell of the housing are additionally interconnected by means of special fastening elements.

A simple and readily realizable method of manufacturing a housing of the kind mentioned in the opening paragraph is characterized by the following steps:

a) the metal part is forced into the desired shape in a deep-drawing tool, b) the metal part thus prepared is laid in an injection molding tool which is formed so as to correspond to the desired outer contours of the housing, c) the inserted metal part is surrounded with injected thermoplastic material, leaving exposed openings provided in the metal part, in accordance with the desired outer contours of the housing.

In accordance with the EMI-shielding requirements, the openings are already provided during the preliminary manufacture of the metal part in the deep-drawing tool. The injection mold is shaped in accordance with the desired outer shape of the housing.

Depending on the desired outer shape of the housing, the injection mold may be correspondingly modified. A new or different injection mold will readily provide a new design for an identical inner shell.

In an embodiment of the invention, the part shaped from metal plating is provided with functional elements at the inside of the housing in the region of openings before injection molding, and the functional elements are connected to the outer shell of the housing during the injection molding process by means of the injected material which passes through the openings. Necessary functional elements may thus be fastened to the inside of the housing without special fastening members.

In a further embodiment of the invention, the part shaped from metal plating is provided with additional openings and the material passing through these openings during the injection molding process forms additional connecting elements between the part shaped from metal plating and the outer shell. The connection between the metal part and the outer shell of the housing may thus be improved in a simple manner.

DE-A-37 36 116 discloses a cover for a keyboard. This keyboard cover is supported by a frame, covers a switching element and an illumination element, and comprises an operational area for the switching element and a translucent display zone in front of the illumination element. The keyboard cover consists of a flexible, translucent foil of flat shape which is connected to the frame with an edge area. A body is injection-molded to the foil so as to form the operational area at a distance from the edge area. The foil forms a pivot portion between the edge area and the body, the printed symbol zone being provided between the body and the pivot portion.

DE-A-36 30 898 discloses an operating and display field of an electronic device which comprises a translucent flexible cover foil made of polyester. In this construction the object is to integrate translucence, printing, surface appearance, and operational functions. This is achieved in that an adhesion layer made of a transparent paint which adheres to polyester is applied on the cover foil, at its lower side opposed to the visible side, next to translucent regions of the operating and display fields, and in that a metal layer having a brush structure is applied on the transparent paint.

EP-A-0 500 330 discloses a flat switch for recessed mounting with an incorporated illumination. This switch comprises three fixed contacts arranged on a conductor plate which can be operated by a resilient, hemispherical membrane. This switch is covered with a tensioned insulating synthetic resin skin for protection purposes.

A further embodiment of the invention is characterized in that the part shaped from metal plating has movable tongues in the region of the keys, which tongues are each connected at one side to said metal part by means of a resilient bridge and are covered by the layer of thermoplastic material. The layer of thermoplastic material which forms the outer shell thus extends also over the tongues themselves while leaving exposed regions which would hamper a movement of the tongues. A keyboard may thus be manufactured without additional components and mounting procedures. The part shaped from metal plating manufactured in a first process is thus also given the resilient tongues which serve as a basis for the keys and which are formed in one process simultaneously with the manufacture of the metal part. Basic materials used are metal and synthetic resin only. This provides a solution which is favorable for recycling because metal and synthetic resin do not pollute one another and thus remain separable. In addition, the metal matrix which forms the keyboard promotes heat removal, i.e. heat distribution over the appliance.

In an embodiment of the invention, the tongues are each formed by a semicircular incision in the part shaped from metal plating and are each connected to said part via a resilient bridge. In a further embodiment of the invention, a further incision is present between the ends of the semicircular incision. The result of this is that each tongue is connected to the part formed from metal plating via two resilient bridges. In both cases, the layer of thermoplastic material may extend so far into the range of each resilient bridge that a movement of the tongues is not hampered.

In an embodiment of the invention, the part shaped from metal plating is provided with openings in the region of the tongues. These openings may serve to improve the adhesion between the thermoplastic material and the tongues in that material penetrates the openings and forms a back support on the opposite side.

In another embodiment of the invention, the tongues are each provided with a central opening and the thermoplastic layer is made of a translucent material in the regions of the central openings. This provides a simple possibility for illuminating the keys formed by the tongues and the material by providing a light source below the keys which shines through the material.

Another embodiment of the invention is characterized by the use of a dual-color injection molding technique with a dark material in the edge regions of the tongues and with a translucent material in the regions of the tongues having the central openings.

Given sharper protection or design requirements, according to a further embodiment of the invention, the interspacings free from thermoplastic material between the keys are closed or covered by a cover plate. This cover plate may either consist of the same thermoplastic material from which the outer shell was manufactured, or, in a further embodiment of the invention, may be manufactured from metal. The keyboard area is substantially screened against electromagnetic interferences thereby.

To obtain the complete keyboard function, the integrated set of keys thus formed is assembled together with the housing shell by means of an arrangement of switches, a switching foil, or a snap switch disc arrangement. Luminescent diodes or other light sources may be used for key illumination.

During the manufacture of a housing, the part shaped from metal plating is provided with resilient tongues in the region of the keys, which tongues are surrounded with thermoplastic material simultaneously with the part shaped from metal plating. Preferably, the tongues connected to the metal part via at least one resilient bridge may be formed by means of stamped-out edge portions.

JP 4-116899 (A) discloses an arrangement for screening the inside of a housing. The housing here comprises a metal core with high-frequency switching circuits arranged on both sides. A U-shaped spring is fastened on the four sides of the core with a tongue extending outwards. When the two-shell housing is assembled, the tongue makes contact with an aluminum film provided on the inside of the housing, so that two chambers formed in the housing can be completely screened off.

A further embodiment of the invention is characterized in that the overlapping ends of the two parts shaped from metal plating form a projection which is dovetail-shaped in cross-section and are held together by at least one closing element which grips over the projection. Such a construction with at least one joint closing element for the two metal parts renders possible a secure closure of the two housing shells in the region of the edge joint, so that a reliable HF sealing between the two housing shells can be obtained. This construction may be further improved in that, in an embodiment of the invention, the closing element is made of an electrically conducting material. A further improvement may be achieved in that the closing element is provided with undercut grooves and/or is constructed resiliently. Such an arrangement renders possible a simple mounting of the closing element.

In a further embodiment of the invention, a single, U-shaped closing element is used which in the mounted state grips around an end edge and at least portions of the two side edges of the housing. After joining together of the two housing shells, a U-shaped closing element thus formed may be passed over the assembly from an end face, so that a simple, quick, and reliable HF-tight connection between the two housing shells is facilitated.

In a further embodiment of the invention, comprising a housing with a reserved space for accommodating an accumulator battery, the latter has dovetail-shaped projections of matching shape, and the side portions of the U-shaped closing element extend over the entire length of the housing. It is safeguarded thereby that a reliable connection between the two housing shells is provided also in the case of such a housing having a reserved space for accommodating a battery.

The interference protection of a housing as mentioned in the opening paragraph may be further improved in that the part shaped from metal plating is constructed as an uninterrupted surface in the region of the keyboard, on which surface a keyboard switching foil is provided whose electrical connections are passed through a single opening into the housing. With a housing of this construction, no through holes for the keyboard are thus required in the upper shell. A single hole for the passage of the electric leads coming from the keyboard switching foil suffices, which leads are connected to components inside the housing. Such a keyboard switching foil may be fastened, for example with glue, to the surface of the metal part which for this purpose comprises, for example, a recess.

Should the heat removal in housings of this construction with shaped metal parts be insufficient, a heat removal facility may be provided in that partial recesses are arranged in the thermoplastic layer forming the outer skin. These may take the form, for example, of slots in a region opposed to the earpiece.

BRIEF DESCRIPTION OF THE DRAWINGS

In the drawing, embodiments of the device according to the invention are depicted diagrammatically in FIGS. 1 to 19.

DETAILED DESCRIPTION OF THE PREFERRED EMBODIMENTS

Figure 1:
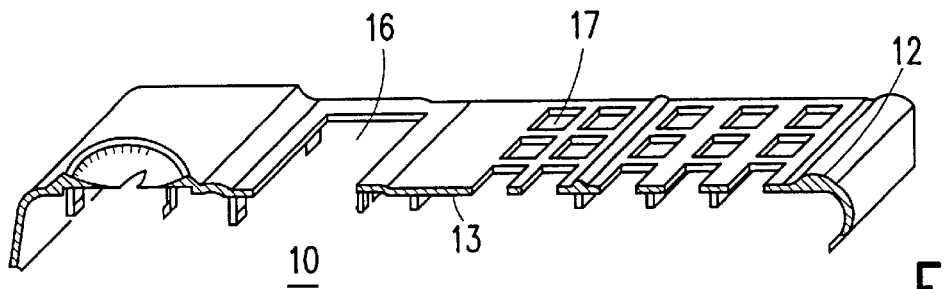
FIG. 1 is a cut-away perspective view of a housing shell of a telephone appliance.
Figure 2:
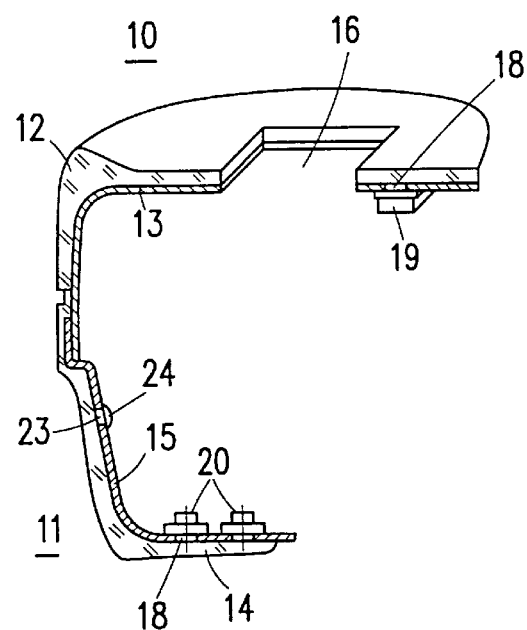
FIG. 2 shows in an enlarged perspective partial cut-away view of the connection of an upper housing shell of FIG. 1 to a lower housing shell.

FIG. 1 shows an upper housing shell 10 which is assembled together with a lower housing shell 11 so as to form a complete housing in accordance with FIG. 2. The upper housing shell 10 has an outer housing layer 12 consisting of thermoplastic material and an inner metal part 13, while the lower housing shell 11 has an outer housing layer 14 consisting of thermoplastic material and an inner metal part 15. The outer housing layer 12, 14 was provided over the relevant pre-shaped metal plating part 13, 15 in an injection molding process. Openings provided for functional purposes are referenced 16, 17.

Figure 3:
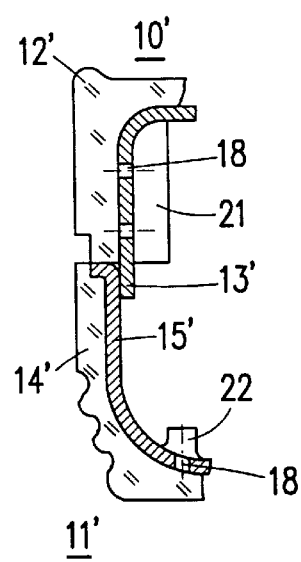
FIG. 3 is a cross-section of a portion of a different kind of connection between two housing halves.

FIG. 3 shows an alternative connecting technique between two housing shells 10', 11' in the region of the butt joints. The metal parts are referenced 13' and 15' here.

The metal parts 13, 15 and 13', 15' of FIGS. 2 and 3 comprise, besides said openings 16, 17, further openings 18. Functional elements 19 to 22, which are fastened to the inside of the housing during the injection molding process by the flow of liquid thermoplastic material through the openings 18, thus fixing the functional elements 19 to 22, are present in the region of these openings 18. In a similar manner, material may pass through further openings 23 during the injection molding process, which material forms fastening elements 24 for connecting the outer layer 12, 14 to the metal part 13, 15.

This renders it possible to manufacture the complete housing of FIG. 2 with outer layer 12, 14, metal part 13, 15, and functional elements 19, 20 in a single injection molding process.

Figure 4:
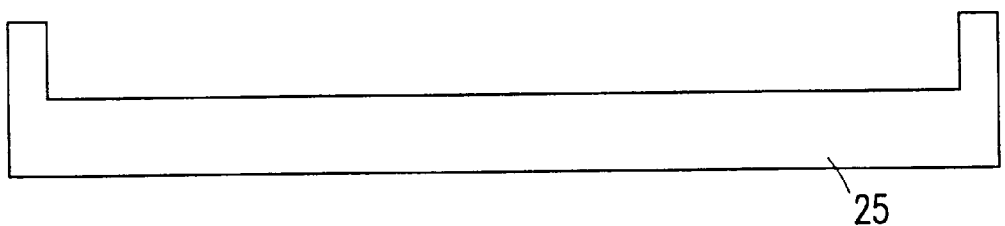
FIG. 4 is a side elevation of a deep-drawing tool.

FIG. 4 is a diagrammatic side elevation of a deep-drawing tool 25 for forming a metal part 13, 15.

Figure 5:
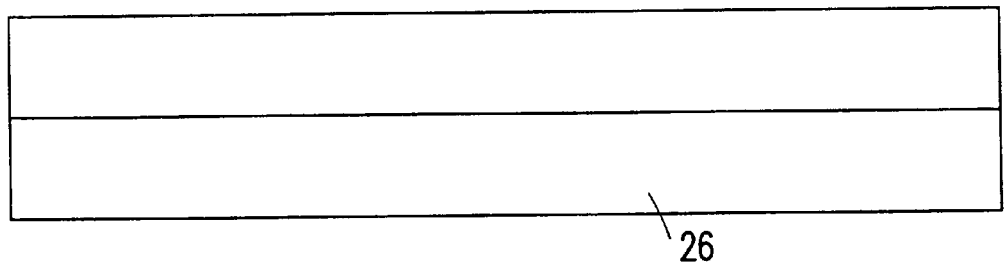
FIG. 5 is a side elevation of an injection mold, FIGS. 6 and 7 each show in plan view a portion of a prepared part made from metal plating in the region of keys of a housing, which is not shown.

FIG. 5 is a diagrammatic side elevation of a two-part injection mold 26 in which the inserted, preshaped metal parts 13, 14 are surrounded with injection-molded material.

Figure 6:
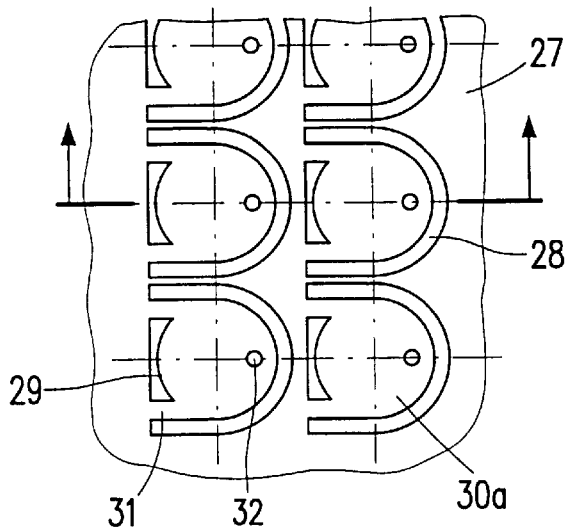
Figure 7:
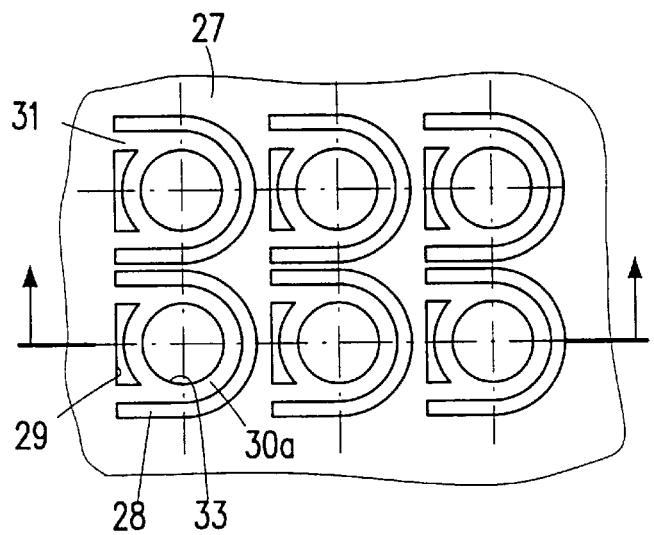

The previously manufactured metal parts 27 of FIGS. 6 and 7 form the basis both for a housing shell and for the keyboard. FIGS. 6 and 7 show tongues 30a,b formed by means of incisions 28 and 29, which tongues are connected to the metal parts 27 via resilient bridges 31. Additional openings 32, 33 serve to fix the thermoplastic material in that it is molded around these openings.

Figure 8:
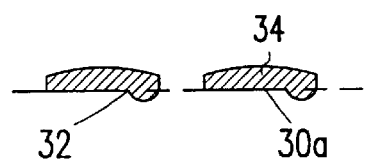
FIGS. 8 and 9 show accompanying cross-sections with additional synthetic resin provided by injection moulding in the regions of the keys, FIGS. 10 and 11 each show in plan view a portion of metal cover plates in the key region.
Figure 9:
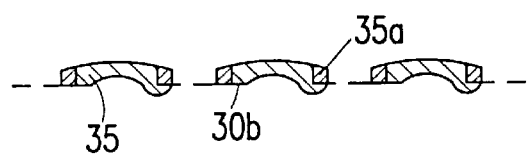

FIGS. 8 and 9 are cross-sections through FIGS. 6 and 7, but with additional injection-molded thermoplastic material 34, 35. In FIG. 8, the material 34 penetrates the openings 32 and serves as a fastening. The material 35 in FIG. 9 also penetrates the larger openings 33, but it is made of a translucent material, so that a light source arranged below the keys can serve to illuminate the keys. In the edge portions of the keys, the material 35a may have a dark colour.

Figure 10:
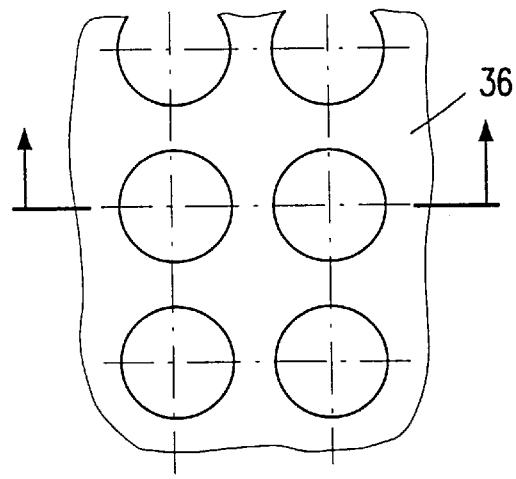
Figure 12:
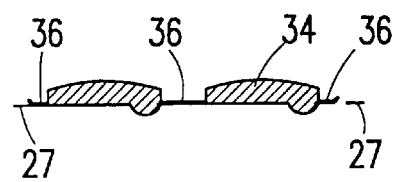
FIGS. 12 and 13 are cross-sections corresponding to FIGS. 5 and 6, with additional synthetic resin provided by injection moulding, FIGS. 14 and 15 each show in partial cross-section an integrated keyboard according to the invention together with a housing shell arranged over a switching device.
Figure 11:
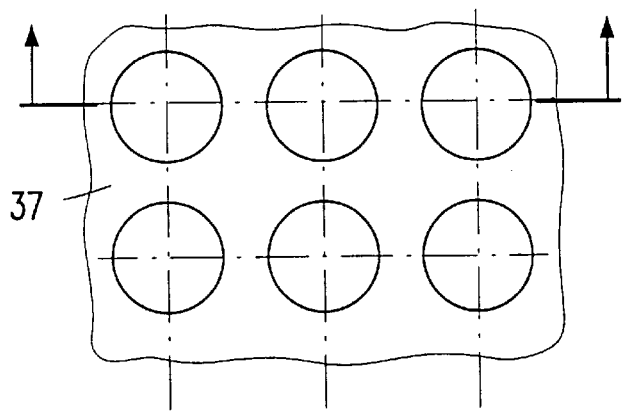

In FIGS. 10 and 11, a metal cover plate 36 is provided between the plastic-coated tongues 30a, which plate screens the interstices substantially against electromagnetic radiation.

Figure 13:
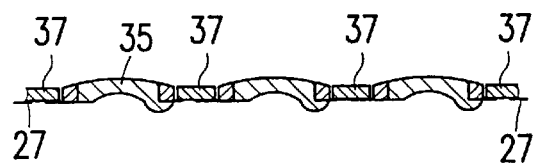

In FIGS. 11 and 13, this cover plate 37 is made from a synthetic resin which may be the same material from which the outer shell of the housing was formed.

Figure 14:
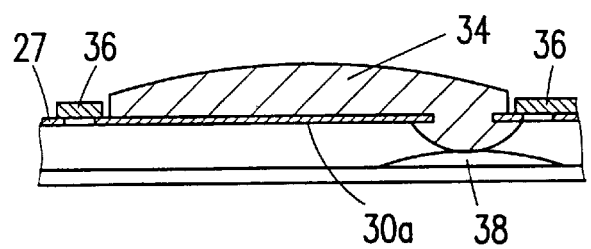
Figure 15:
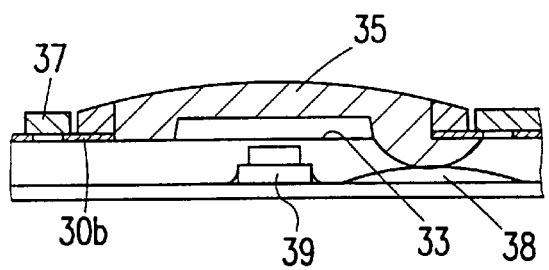

FIGS. 14 and 15 each show an integrated keyboard according to the invention together with the accompanying housing shell arranged over a switching arrangement which, for example, comprises a snap disc mechanism 38. FIG. 14 corresponds to a construction according to FIGS. 6, 8, 10, 12, and FIG. 15 corresponds to a construction according to FIGS. 7, 9, 11, 13. In the latter construction, a light source 39 is arranged below the key.

Figure 16:
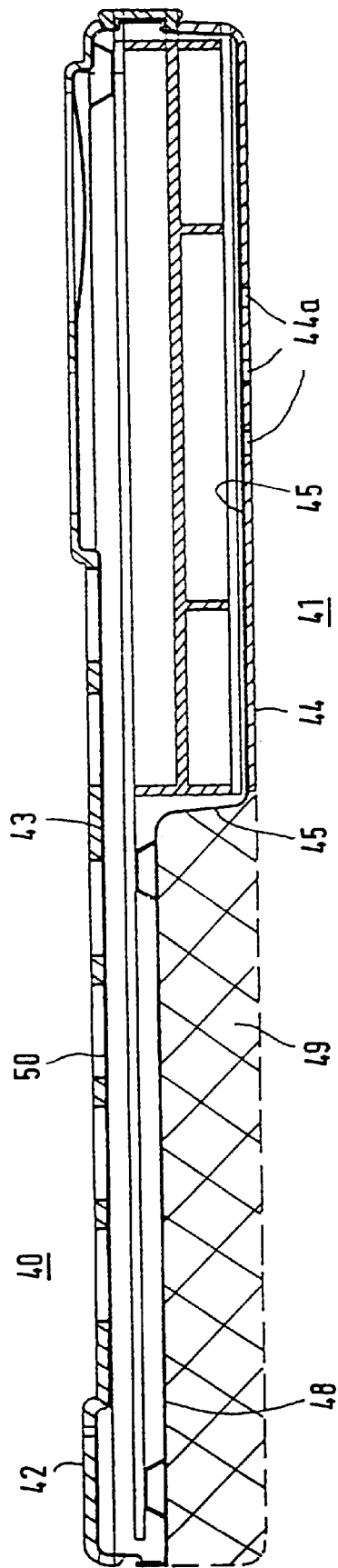
FIG. 16 is a side elevation of a portable telephone in cross-section.

The housing shown in FIGS. 16 to 19 comprises an upper housing shell 40 and a lower housing shell 41 which are combined into a complete housing. The upper housing shell 40 has an outer housing skin 42 made of thermoplastic material and an inner metal part 43. The lower housing shell 41 has an outer housing skin 44 of thermoplastic material and an inner metal part 45. The outer skin 42, 44 was provided on the relevant pre-shaped metal part 43, 45 in an injection molding process. The metal parts 43, 45 overlap with their ends in the region of the joint, as is visible from the end portions shown in FIG. 16, or more clearly from FIG. 18. The overlap results in a contacting, which leads to a reliable HF protection. The two parts are so bent that they form a dovetail-shaped projection 46 in the assembled state in order that the overlapping regions 43a and 45a are fixedly interconnected so as to achieve a good contact. The two parts are held together by a closing element 47 which grips around the dovetail-shaped projection 46 with undercut grooves 47a. This closing element 47 has a U-shape and extends in FIG. 16 in one direction over the right-hand extreme edge and in the other direction over the two side edges of the housing 40, 41. The lower shell 41 of FIG. 16 is provided with a recess 48 for accommodating a battery 49. This battery 49 is also provided with a dovetail-shaped projection (not shown) in the region where the closing element 47 is to be applied, over which projection the U-shaped closing element 47 can be passed with its two side limbs.

Figure 17:
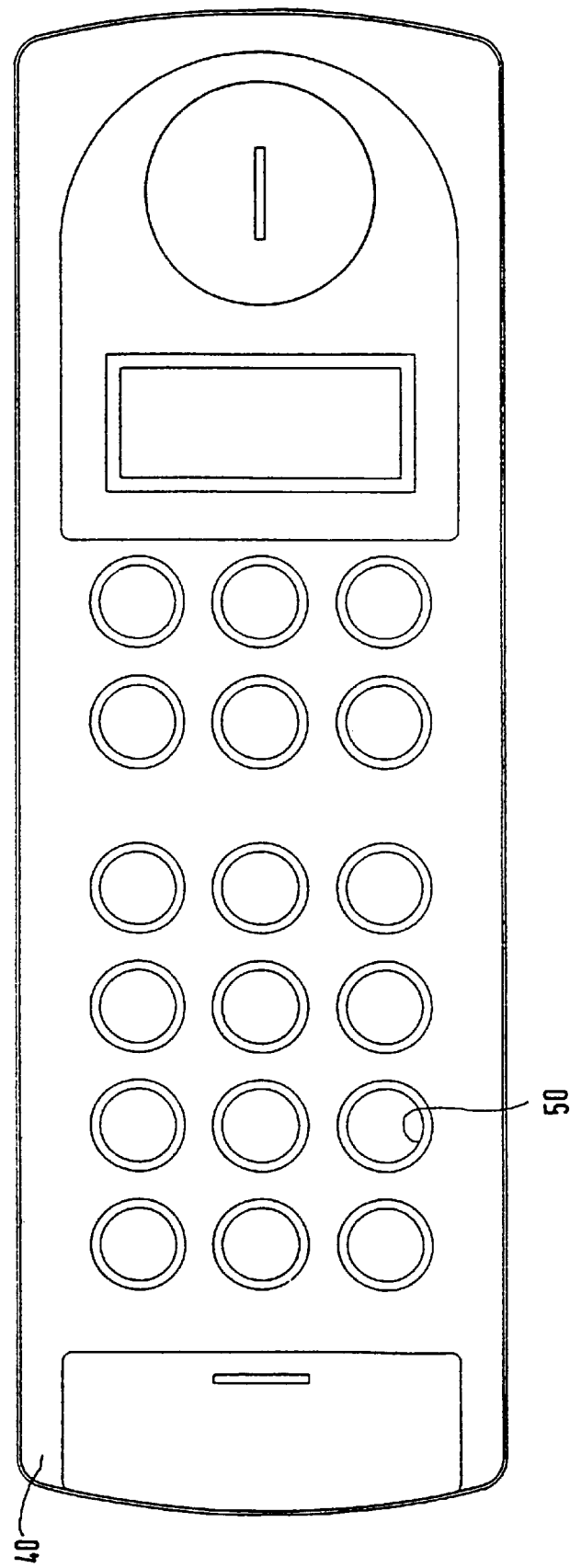
FIG. 17 is a plan view of a portable telephone shown in FIG. 16.
Figure 18:
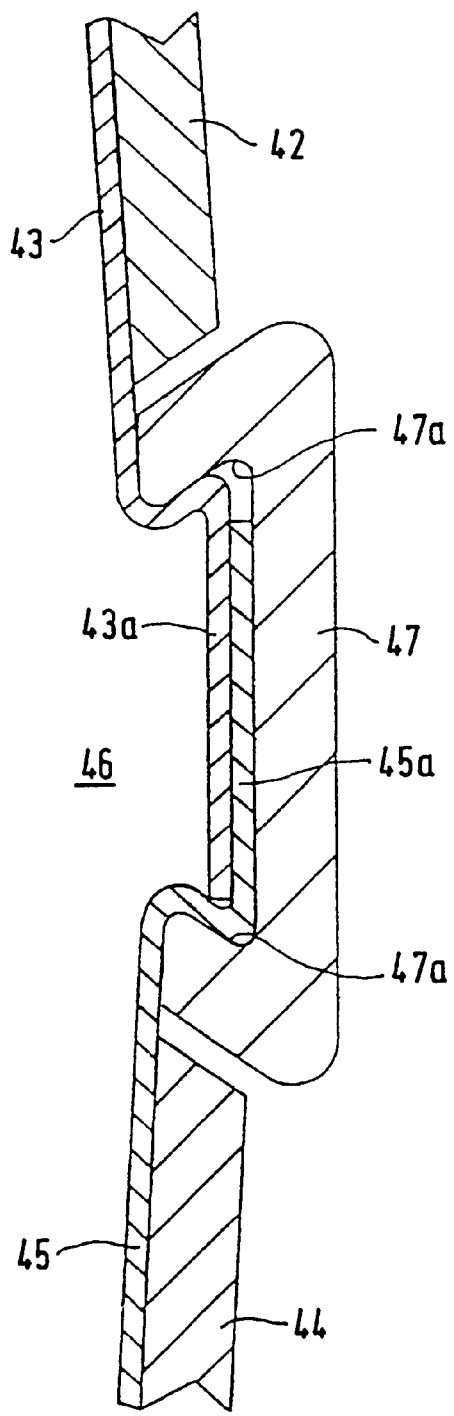
FIG. 18 is an enlarged cross-sectional view of the right-hand end region in FIG. 16.

It is clear from FIGS. 16 and 17 that the metal part 43 of the upper housing shell 40 in this construction comprises recesses 50 for the accommodation of keys which are not shown in detail.

Figure 19:
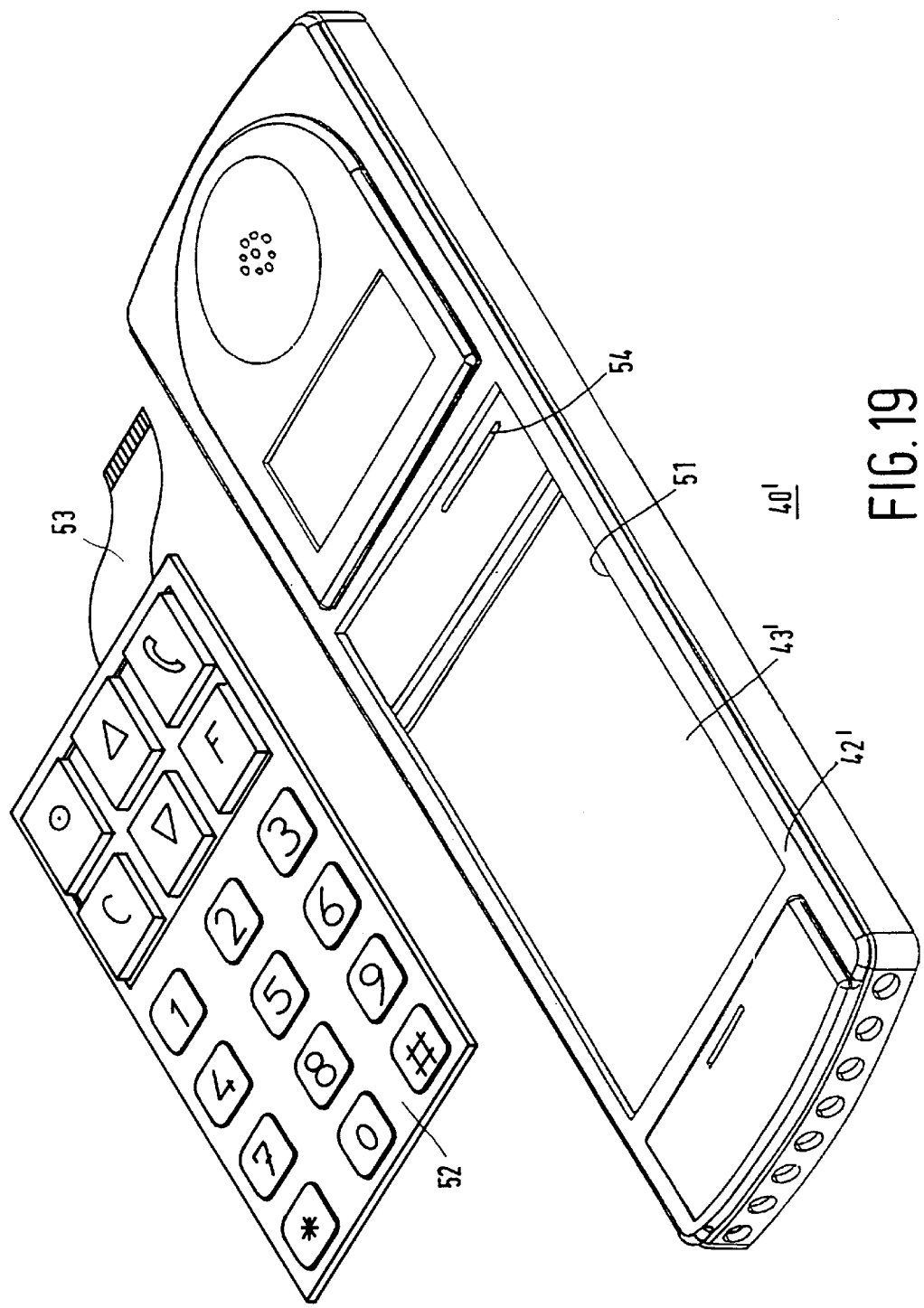
FIG. 19 is a perspective view of a portable telephone with a keyboard switching foil to be applied thereon.

FIG. 19 shows a further embodiment in which an upper housing shell 40' comprises a metal part 43' which has an uninterrupted surface in the region of the keyboard, so without through holes. Instead, the outer housing skin 42' made of thermoplastic material is provided with a recess 51 in the region of the keyboard, into which recess a keyboard switching foil 52 depicted above the housing shell 40' is inserted and held with glue. The accompanying electric leads 53 in the form of a flat cable are guided into the interior of the housing through a slot 54.

We claim:

1. A housing for appliances used in the field of electrical datacommunications, the housing comprising two housing shells, each of said housing shells including a metal interior part being fixedly connected to a thermoplastic outer shell by fastening elements, wherein portions of said metal interior parts of said two housing shells have overlapping ends to form a projection which is dovetail-shaped in cross-section, said overlapping ends being held together by at least one closing element which grips over the projection.

2. A housing for appliances used in the field of electrical datacommunications, the housing comprising two housing shells, each of said housing shells including a metal interior part being fixedly connected to an outer shell which is made of thermoplastic material, wherein said metal interior part has movable tongues, each of said tongues being connected at one side to said metal part by a resilient bridge and being covered by said thermoplastic material, wherein portions of said metal interior parts of said two housing shells have overlapping ends to form a projection Which is dovetail-shaped in cross-section, said overlapping ends being held together by at least one closing element which grips over the projection.

3. A housing for appliances used in the field of electrical datacommunications, the shells including a metal interior part being fixedly connected to an outer shell which is made of thermoplastic material, wherein said metal interior part has movable tongues, each of said tongues being connected at one side to said metal part by a resilient bridge and being covered by said thermoplastic material, and wherein the tongues are each formed by a substantially semicircular incision, wherein portions of said metal interior parts of said two housing shells have overlapping ends to form a projection which is dovetail-shaped in cross-section, said overlapping ends being held together by at least one closing element which grips over the projection.

4. A housing for appliances used in the field of electrical datacommunications, the housing comprising two housing shells, each of said housing shells including a metal interior part being fixedly connected to an outer shell which is made of thermoplastic material, wherein said metal interior part has movable tongues, each of said tongues being connected at one side to said metal part by a resilient bridge and being covered by said thermoplastic material, wherein each of the tongues is formed by a substantially semicircular incision, and wherein each of the tongues is provided with a central opening and the thermoplastic material is translucent in a region of the central opening, wherein portions of said metal interior parts of said two housing shells have overlapping ends to form a projection which is dovetail-shaped in cross-section, said overlapping ends being held together by at least one closing element which grips over the projection.

5. A housing for appliances used in electrical datacommunications, the housing comprising two housing shells, each of said housing shells including a metal interior part being fixedly connected to an outer shell which is made of thermoplastic material, wherein portions of said metal interior parts of said two housing shells have overlapping ends to form a projection which is dovetail-shaped in cross-section, said overlapping ends being held together by at least one closing element which grips over the projection, wherein the metal interior part of one of said housing shells is shaped from metal plating and is constructed as an uninterrupted surface for holding a keyboard switching foil having a cable which passes through an opening on said one housing shell.

6. A housing for appliances used in electrical datacommunications, the housing comprising two housing shells, each of said housing shells including a metal interior part being fixedly connected to an outer shell which is made of thermoplastic material, wherein portions of said metal interior parts of said two housing shells have overlapping ends to form a projection which is dovetail-shaped in cross-section, said overlapping ends being held together by at least one closing element which grips over the projection.

7. A housing as claimed in claim 6, wherein the at least one closing element is U-shaped to grip side edges of the two housing shells.

* * * * *